US010528692B1

(12) United States Patent
Guo et al.

(10) Patent No.: US 10,528,692 B1
(45) Date of Patent: Jan. 7, 2020

(54) CELL-AWARE DEFECT CHARACTERIZATION FOR MULTIBIT CELLS

(71) Applicant: Synopsys, Inc., Mountain View, CA (US)

(72) Inventors: Ruifeng Guo, Portland, OR (US); Brian M. Archer, Mountain View, CA (US); Kevin Chau, San Jose, CA (US); Xiaolei Cai, Portland, OR (US)

(73) Assignee: Synopsis, Inc., Mountain View, CA (US)

( * ) Notice: Subject to any disclaimer, the term of this patent is extended or adjusted under 35 U.S.C. 154(b) by 0 days.

(21) Appl. No.: 16/177,033

(22) Filed: Oct. 31, 2018

Related U.S. Application Data

(60) Provisional application No. 62/582,351, filed on Nov. 7, 2017.

(51) Int. Cl.
*G06F 17/50* (2006.01)

(52) U.S. Cl.
CPC .......... *G06F 17/504* (2013.01); *G06F 17/505* (2013.01)

(58) Field of Classification Search
CPC .............................. G06F 17/504; G06F 17/505
USPC ........................................................ 716/103
See application file for complete search history.

(56) References Cited

U.S. PATENT DOCUMENTS

| 8,813,004 | B1* | 8/2014 | O'Riordan | G06F 17/5036 |
| | | | | 716/100 |
| 9,361,417 | B2 | 6/2016 | Arunachalam et al. | |
| 9,779,197 | B1* | 10/2017 | Wagner | G06F 17/5068 |
| 2008/0301608 | A1 | 12/2008 | McElvain | |
| 2015/0227646 | A1 | 8/2015 | Arunachalam et al. | |
| 2018/0039721 | A1* | 2/2018 | Guo | G06F 17/5036 |

OTHER PUBLICATIONS

Cummings, Clifford E., article entitled "Synthesis and Scripting Techniques for Designing Multi-Asynchronous Clock Designs", Sunburst Design, Inc., SNUG San Jose 2001, 26 pages.
Pateras, Stephen, EDN Network article entitled "Ensure FinFET defect coverage with cell-aware test", May 6, 2013, 4 pages.

(Continued)

*Primary Examiner* — Suresh Memula
(74) *Attorney, Agent, or Firm* — Bever, Hoffman & Harms, LLP

(57) ABSTRACT

A cell-aware defect characterization method includes partitioning a multibit cell netlist file into multiple single-bit partition netlist files, and then generating a cell-aware test model for each partition netlist file. Partitioning is performed such that each partition netlist file includes a corresponding flip-flop along with input, output and control pins that are operably coupled to the input, output and control terminals of the corresponding flip-flop, and all active, passive and parasitic circuit elements that are coupled in the signal paths extending between the corresponding flip-flop and the input/output/control pins. Shared resources (e.g., clock or scan select pins and associated signal lines) that are utilized by two or more flip-flops are included in each associated partition. The partitioning process is performed using either a structural back-tracing approach or a logic simulation approach.

20 Claims, 10 Drawing Sheets

(56) References Cited

OTHER PUBLICATIONS

Gulati, Jasmine Kaur, Indraprastha Institute of Information Technology Delhi article entitled "An Efficient Timing and Clock Tree Aware Placement Flow with Multibit Flip-Flops for Power Reduction", Jun. 2016, 54 pages.

Knowles, Matt, Tessent Solutions article entitled "Boost FinFET Yield with Cell-aware Scan Diagnosis", Jul. 25, 2017, 3 pages.

* cited by examiner

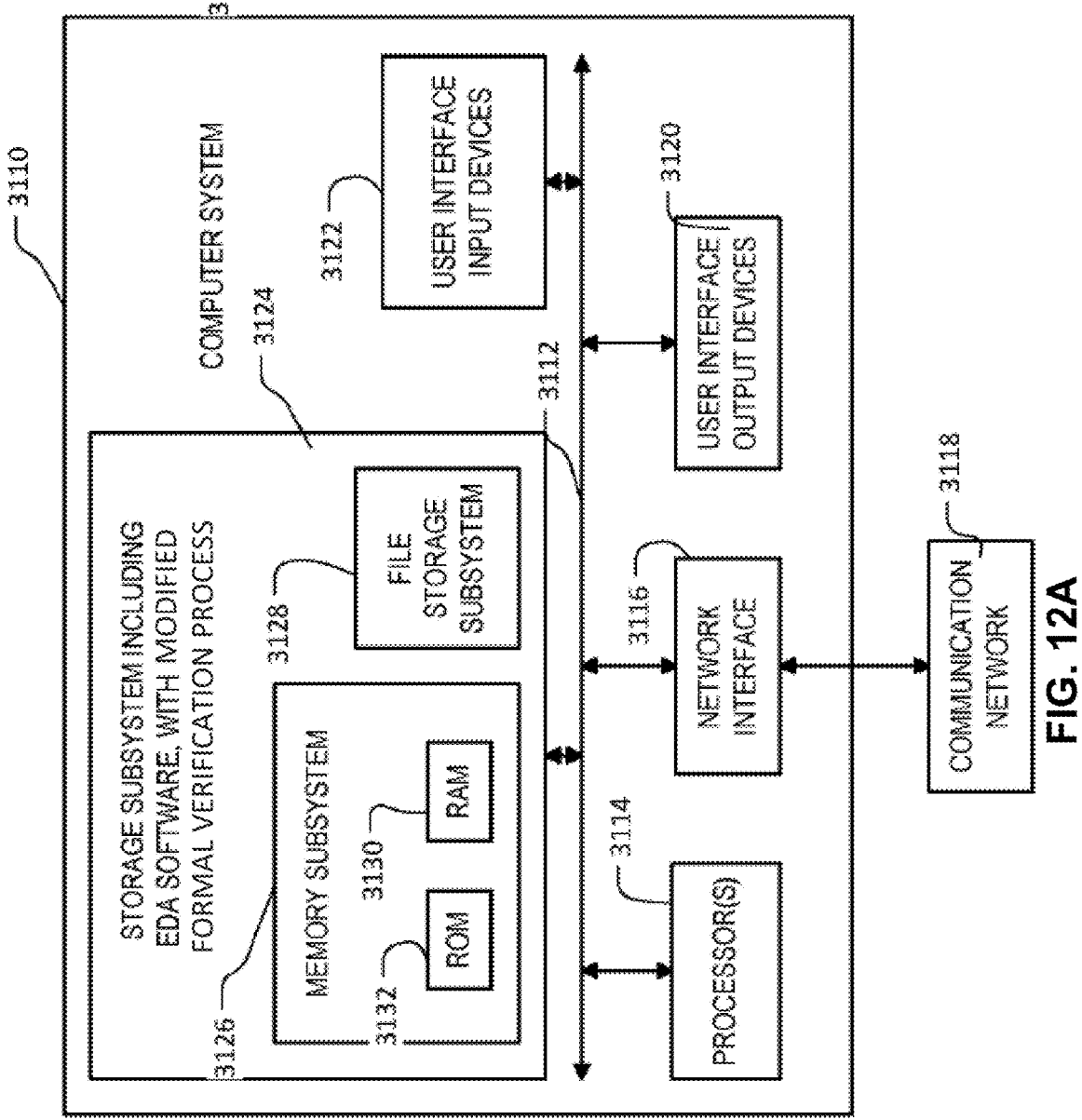
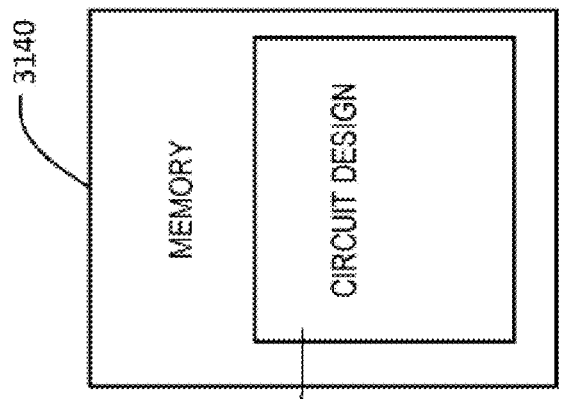
FIG. 12B
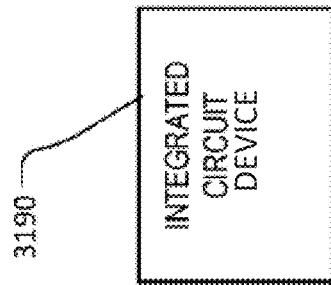
FIG. 12C
FIG. 12A

CELL-AWARE DEFECT CHARACTERIZATION FOR MULTIBIT CELLS

RELATED APPLICATION

This application claims priority from U.S. Provisional Patent Application 62/582,351, entitled "CELL-AWARE DEFECT CHARACTERIZATION FOR MULTIBIT CELLS", which was filed on Nov. 7, 2017, and is incorporated by reference herein.

FIELD OF THE INVENTION

The present invention generally relates to test and diagnosis processes utilized during the development and fabrication of integrated circuit (IC) devices, and more specifically to improved methods for performing cell-aware defect characterization of complex (e.g., multibit) cells.

BACKGROUND OF THE INVENTION

Complex integrated circuit (IC) designs are typically composed of a multitude of standard cells (referred to herein simply as "cells") that are copied from a standard cell library and placed at selected locations within the IC design. Each standard cell represents a pre-designed circuit portion that performs a designated function and is described using several levels of abstraction typically including a logical view, a netlist view and a layout view. The logic view of a given cell describes, for example, the Boolean logic functions performed by the cell's pre-designed circuit portion. The netlist (or schematic) view of each cell typically includes a SPICE-based netlist file that provides a nodal description of the cell's circuit portion, including active elements (e.g., transistors), passive elements (e.g., resistors and capacitors), parasitic elements (e.g., capacitances or inductances generated by adjacent element structures), and all interconnect structures (e.g., metal lines and inter-metal via structures, referred to herein as "signal paths") that collectively form the pre-designed circuit portion, and provides an accurate prediction of output signal responses to different patterns of input signals applied to input pins of the pre-designed circuit portion. The layout view of each cell provides an effective fabrication blueprint (i.e., a series of photolithographic mask/reticle patterns) that is utilized during fabrication to produce a physical instantiation of the pre-designed circuit portion in one or more designated regions of a physical IC device. For brevity, unless otherwise specified, references to "cell" or "standard cell" herein refer to a cell's netlist view, even if a corresponding figure appears to depict another view.

Modern IC designs greatly benefit from the use of standard cells. Such IC devices are the product of a design and fabrication process that typically involves the use of one or more electronic design automation (EDA) software tools. These EDA software tools significantly reduce the design process by way of allowing IC designers to select cells from the available cell library that perform needed circuit functions, and to place the cells in designated locations of a software-based IC design such that the cells' netlists are automatically operably connected to the netlists of adjacent cells or custom circuitry, which facilitates software-based verification that the assembled IC design will perform a desired circuit function. In addition, because standard cells are provided with layout views, the use of standard cells greatly simplifies the fabrication process by avoiding the need for circuit designers to generate layout details for the corresponding circuit portions.

Although the use of standard cells greatly simplifies the design and fabrication process, the number of manufacturing defects associated with the fabrication of standard cells has increased as the minimum features sizes of state-of-the-art fabrication processes nodes continues to decrease. A problem with technology scaling is that it can produce unexpected manufacturing (physical) defects (e.g., shorts, opens, and transistor defects) within physical implementations of the associated standard cells, thereby affecting manufacturing yields by causing a significant number of the host IC devices to fail. Recently, manufacturing (fabrication) defects within standard cells has been recognized as the most important factor that impacts a product yield ramp and yield analysis of IC devices fabricated using technology nodes having minimum feature sizes of 16 nm and below.

Rapid identification and correction of manufacturing defects is important to the commercial success of an IC device. Manufacturing defects are unfortunately an inherent part of developing and producing any new IC device. Feature sizes on IC designs have continued to decrease and the complexity of fabrication process technology has continued to increase according to Moore's Law, which in-turn makes acceptable IC manufacturing yields (i.e., the number of properly functioning IC devices on each fabricated wafer) harder to achieve due to manufacturing defects. Therefore, predicting and/or characterizing the sometimes subtle effects of different types of defects on complex IC performance have become ever more important. Several testing processes have been developed for identifying and localizing specific manufacturing defects (faults) that occur within an IC device, and diagnosis of these specific faults facilitates corrective actions (e.g., changes to layout features or modifications to the fabrication process parameters) that facilitate improved production yields in subsequent fabrication runs. The sooner all design and manufacturing defects are identified and corrected, the sooner production yields for a new IC device can be improved to commercially viable levels.

Cell-aware test (defect characterization) methodologies were recently developed to address failures of conventional test and diagnosis processes to identify manufacturing defects associated with standard cells. Conventional testing processes use automatic test—pattern-generation (ATPG) tools to apply test patterns based on logic-based fault models to identify manufacturing defects. The test patterns generated in accordance with logic-based fault models typically include input pattern sets capable of detecting, for example, stuck-at and transition faults in the lowest-level IC design components and their connections. A problem with utilizing these conventional testing processes to generate test models for standard cells is that standard cells were recognized by conventional testing methods as lowest-level design components, and thus testing a given cell (e.g., a multiplexer cell or multibit cell) using test models generated from logic-based fault models often failed to recognize actual faults occurring within the cells of physical IC devices, resulting in prolonged yield ramps. Accordingly, cell-aware test methodologies were developed to generate cell-aware test models that are based on each cell's behavior in response to an exhaustive series of simulated defects that can occur at any point within the cell's layout. Cell-aware test models generated by these methodologies, when utilized by a suitable test and diagnostic system (e.g., an ATPG tool), have greatly improved test quality and accuracy of manufacturing test generation, defect diagnosis and yield analysis, whereby improving production yields more quickly that was possible using conventional testing methods. However, the effort to extract cell-aware defect behavior is not trivial—it often requires intensive effort of SPICE simulation and defect behavior classification.

Based on interactions between the present inventors and specialists in the test and diagnosis community, a current problem associated with conventional cell-aware test methodologies is that they require an extraordinary amount of time to prepare cell-aware fault models for larger standard cells such as multibit cells (i.e., cells including two or more flip-flops that respectively store data bit values). Specifically, conventional cell-aware test methods exhaustively enumerate all possible input pin value vectors/combinations (for an n-input cell, the number of combinations is $2^n$; i.e., two to the power of n vectors) to check whether a cell aware defect can be detected or not. This long cell-aware test processing time is a particular problem with multi-bit cells, which are usually among the largest cells in a standard library set, and which are widely used to reduce power consumption in large IC designs (e.g., more than 80% of the sequential elements implemented in some IC designs comprise multibit cells). Because each multibit cell contains multiple flip-flops, its SPICE-based netlist view is typically much larger than comparable regular design cells, so the number of defects to characterize increases accordingly. Further, the number of input pins used by a multibit cell is typically larger than regular cells, which requires a larger number of test vectors to analyze during defect characterization. As a result, cell-aware defect characterization for multibit cells using conventional methodologies takes a very long time (i.e., at least a few days, and up to weeks depending on the number of bits and the drive strength of the cell). Moreover, conventional cell-aware defect characterization methods treat each multibit cell as a single big standard cell. Accordingly, during physical-aware fault diagnosis, the fault diagnosis tool can only point to the bounding box of the big multibit cell, not to the specific location of the actual defect. For example, for scan chain failure diagnosis, the diagnosis tool usually points to the scan cell that has the defect—if such a scan cell is part of a multibit cell, the location of the defect is generally identified by the physical diagnosis tool using the bounding box of the full multibit cell, which is usually a big area in the layout.

What is needed is an improved cell-aware defect characterization methodology that substantially reduces the amount of time required to generate cell-aware test models for multibit cells in comparison to conventional methods. What is also needed is a cell-aware defect characterization methodology that provides a more detailed and accurate location of defects in multibit cells in comparison to conventional methods.

SUMMARY OF THE INVENTION

The present invention is directed to a computer-implemented cell-aware defect characterization method for multibit cells that substantially reduces computer processing time by way of partitioning a netlist of a given multibit cell into multiple single-bit cell partition netlists, and then generating a cell-aware test model for each partition netlist. In accordance with an aspect of the invention, partitioning is performed such that an N-bit cell netlist (i.e., a cell including N flip-flops) is effectively divided into N single-bit partition (sub-cell) netlists, with each partition netlist including one flip-flop, associated input pins that are operably coupled to the input terminal of the flip-flop, one or more associated output pins operably coupled to the output terminal(s) of the flip-flop, one or more control pins coupled to the control terminal(s) of the flip-flop, and associated component and/or parasitic elements that are coupled to signal paths extending between the flip-flop and the corresponding input pins, output pins and control pins. In accordance with another aspect of the invention, generating the cell-aware partition test models involves performing cell-aware defect behavior extraction once for each partition netlist (e.g., by performing fault simulation on each partition netlist file, and then utilizing results from the fault simulation to generate a separate cell-aware test model for each partition netlist file). During subsequent physical-aware logic diagnosis (test/diagnostic processes) performed on post-fabrication (physical) IC devices, each of the multiple cell-aware partition test models is applied separately to physical instantiations of the multibit cell using techniques similar to those used in conventional approaches to accurately identify fabrication defects within multibit cells, thereby facilitating manufacturing yield improvement. Although the cell-aware defect characterization method of the present invention requires a computer processor to perform a larger number of tasks (i.e., partitioning and separate cell-aware defect behavior extraction processes for each of the multiple partitions—by way of comparison, conventional methods do not perform partitioning, and cell-aware defect behavior extraction is performed only once for the entire multibit cell), the inventors have discovered that, due to the smaller number of inputs and elements disposed in each single-bit partition, the cell-aware defect characterization method of the present invention generates an aggregate cell-aware test model of the multibit cell (i.e., by way of combining the cell-aware test models) in a substantially shorter amount of time than that required by conventional methods to generate a comparable cell-aware test model of the multibit cell. Moreover, because each cell-aware partition test model addresses defects occurring in a corresponding portion of the chip area occupied by the physical multibit cell, the present invention provides a more detailed and accurate location information of defects in multibit cells than is possible using conventional methods.

In some embodiments, "shared" portions of each multibit cell that transmit control or input signals to multiple flip-flops in a multibit cell are replicated in (copied into) each partition that includes one of the multiple flip-flops. For example, when two flip-flops in a two-bit cell are controlled by a single clock signal, both partition netlist files generated during partitioning of the two-bit cell include a shared portion of the two-bit cell including the clock (control) pin and all active, passive or parasitic elements that are operably connected to the signal line extending between the clock pin and the clock/control terminals of the two flip-flops. Similarly, when two scan flip-flops in a two-bit cell are operably controlled by a single scan enable input signal, both partition netlist files generated during partitioning include a corresponding shared portion of the two-bit cell including the scan enable (input) pin and all active, passive or parasitic elements that are operably connected to the signal line extending between the scan enable pin and corresponding multiplexers of the two scan flip-flops. Replicating these "shared" portions in each related partition facilitates the generation of high quality cell-aware defect characterization without significantly increasing total processing time.

In alternative embodiments, partitioning of each multibit cell is performed using either a structural back-tracing technique or a logic simulation technique. The structural back-tracing technique involves back-tracing from a selected output pin to corresponding input and control pins of a multibit cell, marking the flip-flop and each additional element of the multibit cell encountered during the back-tracing process, generating a corresponding SPICE-based partition netlist including only the marked elements, and then repeating this back-tracing process for all remaining output pins. Because this process is structural analysis, there is no need for circuit simulation, and the back tracing method is straightforward and usually runs very fast. The logic simulation technique involves performing SPICE simulation by applying all possible input combinations to the input pins of each flip-flop while keeping the input pins of other bits at a fixed (e.g., "0") value. While simulating the multibit netlist for a selected flip-flop, any elements having values that toggle between 0 and 1 are marked, and then all the marked elements are included in the partition netlist file generated for the given flip-flop. This simulation-based partition method requires circuit simulation setup and vector preparation, so it usually takes longer to perform than the back-tracing method.

According to alternative practical embodiments, the present invention is implemented as part of an EDA software tool that is configured to execute the cell-aware defect characterization method when operably loaded and executed by a processor in a computer, or as an electronic structure (e.g., a computer or system) that is programmed to execute the EDA software tool. As set forth above, when operably loaded and executed by a processor in a computer, the cell-aware defect characterization software tool performs the above-mentioned cell-aware defect characterization method on multibit cells, which are typically stored in a cell library. The cell-aware defect characterization process may be performed before, during or after the design phase of an IC design. The cell-aware test models generated for each multibit cell implemented in the IC design may be used to perform test and diagnostic processes on physical (post-fabrication) IC devices that are produced in accordance with the IC design, for example, to improve production yields by way of efficiently identifying actual manufacturing defects present in the physical instantiations of the multibit cells.

BRIEF DESCRIPTION OF THE DRAWINGS

These and other features, aspects and advantages of the present invention will become better understood with regard to the following description, appended claims, and accompanying drawings, where:

FIGS. 12A, 12B and 12C are simplified block diagrams of a computer system suitable for use with embodiments of the technology, as well as circuit design and circuit embodiments of the technology.

DETAILED DESCRIPTION OF THE DRAWINGS

The present invention relates to an improved cell-aware defect characterization method for use during the development and fabrication of IC devices. The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary embodiments. In the interest of not obscuring the presentation of embodiments of the claimed inventions, in the following Detailed Description, some processing steps or operations that are known in the art may have been combined together for presentation and for illustration purposes and in some instances may have not been described in detail. However, a person skilled in the art will recognize that these embodiments may be used in commerce without these specific details or with equivalents thereof. In other instances, well-known processes and devices are not described in detail as not to unnecessarily obscure aspects of these embodiments. In other instances, some processing steps or operations that are known in the art may not be described at all. The following description is instead focused on the distinctive features or elements of various embodiments of the claimed inventions. Furthermore, while this description may refer to some components of the structure in the singular tense, more than one component may be depicted throughout the figures and like components are labeled with like numerals.

The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of an intervening transistor).

Figure 1:
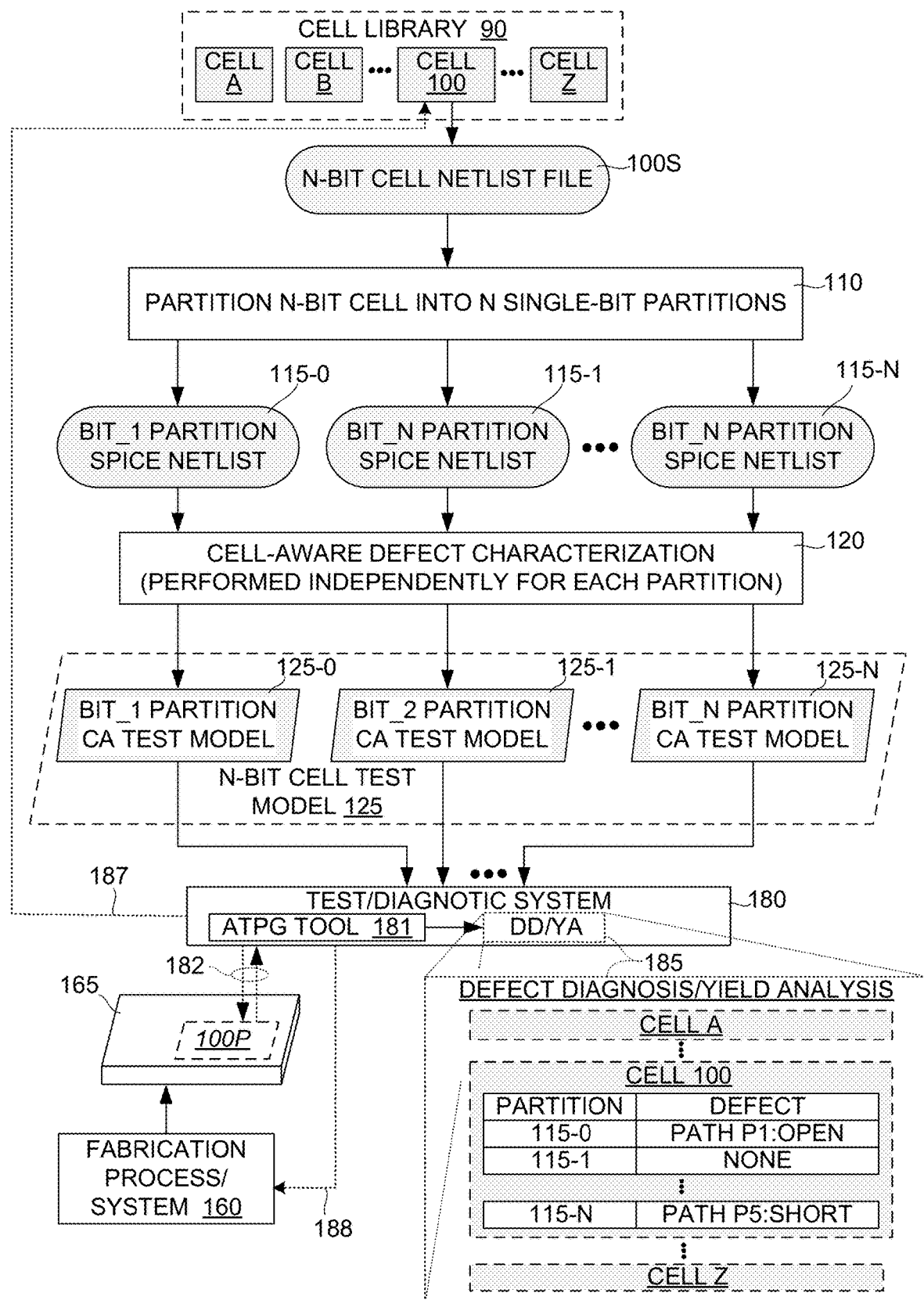
FIG. 1 is a flow diagram showing a method for automatically generating cell-aware test models for multibit cells according to a generalized embodiment of the present invention.

FIG. 1 is a flow diagram showing a generalized method for automatically generating cell-aware test models for an N-bit (multibit) cell 100, and also depicts use of the cell-aware test models during a subsequent test and diagnostic process applied to a fabricated IC device 165 including a physical instantiation (implementation) 100P of N-bit cell 100.

Referring to the top of FIG. 1, a cell library 90 is depicted that stores multiple cells CELL A to CELL Z including an N-bit (multibit) cell 100. Cells CELL A to CELL Z represent standard (or other) cell descriptions stored using a SPICE netlist or other suitable storage format. As explained above, each cell CELL A to CELL Z is a pre-designed circuit portion described using several abstractions typically including a logical view, a netlist view and a layout view. As understood in the art, cells CELL A to CELL Z are incorporated into corresponding regions of an IC design during development of the IC design, where each cell is operably coupled to adjacent circuit portions (e.g., other cells) by way of input, output and control pins. Note that the method described below as being applied to N-bit cell 100 may be utilized to characterize cells CELL A to CELL Z.

Figure 2:
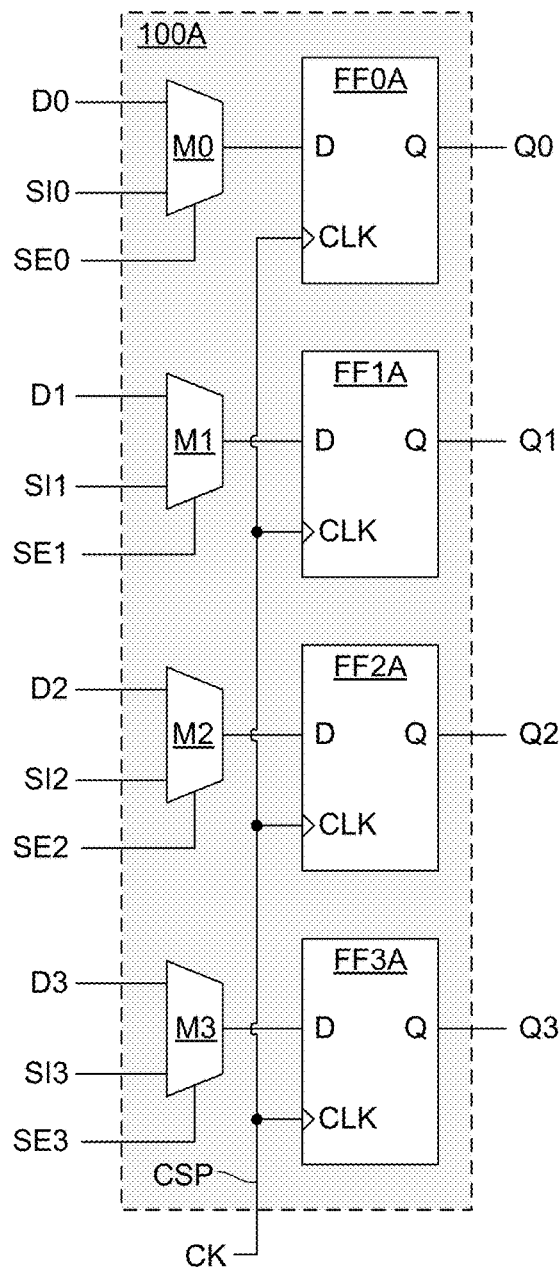
FIG. 2 depicts a simplified multibit cell according to an exemplary embodiment of the present invention.

N-bit cell 100 is characterized as a cell configured to include N bit-storage devices (e.g., flip-flops, multi-stable vibrators or latches, which are collectively referred to herein as "flip-flops" for brevity), where N is an integer greater than one. As described by way of examples set forth below, N-bit cell 100 is further characterized including multiple (e.g., 3*N) input pins that are operably coupled to input terminals of the N flip-flops, multiple (e.g., N) output pins operably coupled to output terminals of the N flip-flops, and one or more control pins coupled to control terminals of the N flip-flops. For example, FIG. 2 depicts a four-bit cell 100A including four D-type flip-flops FF0A to FF03, twelve input pins D0 to D3, SI0 to SI3 and SE0 to SE3 that are operably coupled to input terminals D of flip-flops FF0A to FF03, four output pins Q0 to Q3 that are coupled to output terminals Q of flip-flops FF0A to FF03, and a clock (control) pin CK that is coupled to control terminals CLK of flip-flops FF0A to FF03. In other embodiments (not shown), a multibit cell may include two or more flip-flops of another type (e.g., T flip-flops or JK flip-flops), or of the same type but with different internal designs.

Referring to the upper portion of FIG. 1, the method begins by receiving (e.g., directly from library 90 or by way of a suitable intervening conversion tool) an N-bit (multibit) netlist file 100S that operably describes all active and parasitic circuit elements utilized by multibit cell 100. For example, referring to FIG. 2, a multibit cell SPICE netlist file for exemplary multibit cell 100A operably describes all active and parasitic transistors elements forming multiplexers M0 to M3 and flip-flops FF0A to FF03, along with any active or parasitic elements that may be operably coupled to the signal paths utilized, for example, to transmit input signals from input pins D0 to D3, SI0 to SI3 and SE0 to SE3 to input/control terminals of multiplexers M0 to M3, to transmit selected signals from output terminals of multiplexers M0 to M3 to input terminals Q of flip-flops FF0A to FF03, to transmit clock signals from clock (control) input pin CK to clock (control) terminals of flip-flops FF0A to FF03, and to transmit output signals from output terminals Q of flip-flops FF0A to FF03 to output pins Q0 to Q3. In a practical embodiment, multibit cell SPICE netlist file 100S is generated using a standard SPICE-compatible format such as Synopsys Binary Parasitic Format (SBPF) or Standard Parasitic Exchange Format (SPEF).

Figure 3:
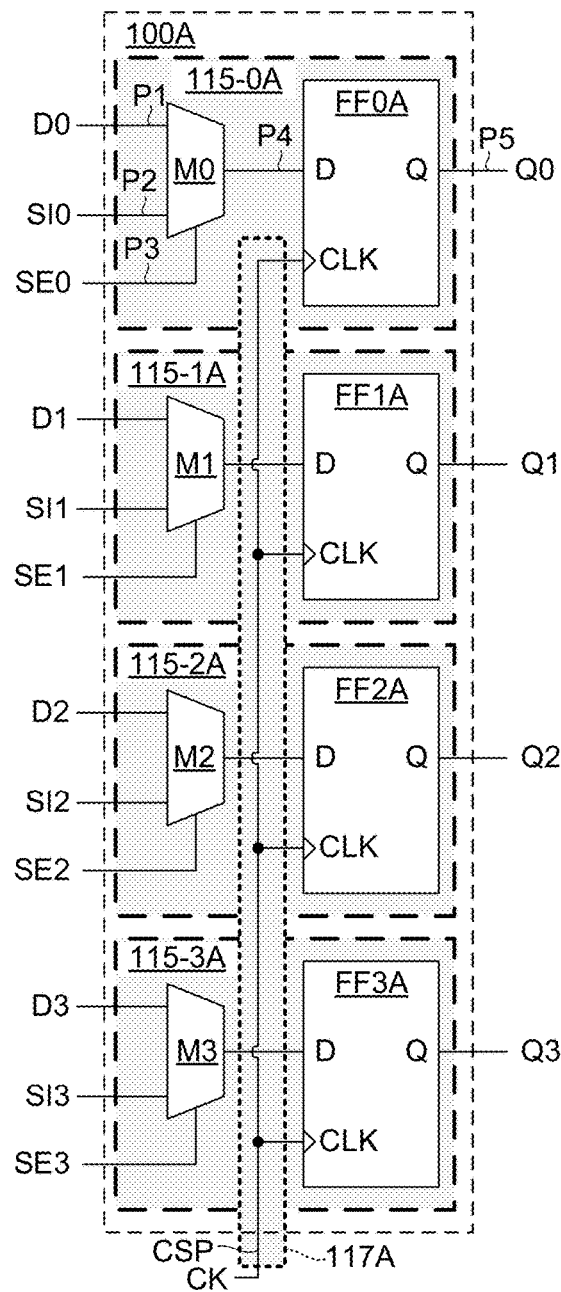
FIG. 3 depicts the multibit cell of FIG. 2 after being partitioned into four single-bit partitions in accordance with an embodiment of the present invention.

Referring again to FIG. 1, the N-bit cell netlist file 100S is then partitioned into N single-bit partition netlist files 115-0 to 115-N such that each partition netlist file includes a corresponding flip-flop, an associated portion of the input pins of N-bit cell 100, an associated output pin, an associated clock (control) pin CK, and associated component and parasitic elements that are coupled to signal paths extending between the corresponding flip-flop and the corresponding input, output and control pins. For example, referring to FIG. 3, the four-bit cell netlist file 100A is partitioned into four single-bit partition netlist files 115-0A to 115-3A, where partition netlist file 115-0A includes corresponding flip-flop FF0A, associated input pins D0, SI0 and SE0 that are operably coupled to input terminal D of flip-flop FF0A (i.e., by way of multiplexer M0), associated output pin Q0 that is operably coupled to output terminal Q of corresponding flip-flop FF0A, clock (control) pin CK that is operably coupled to clock (enable) terminal CLK of corresponding flip-flop FF0A by way of clock signal path CSP, and associated component and parasitic elements (i.e., including multiplexer M0) that are coupled to signal paths P1, P2, P3, P4 and P5 that extend between corresponding flip-flop (e.g., FF0) and input pins D0, SI0 and SE0 or output pin Q0. As also indicated in FIG. 3, partition netlist file 115-1A includes corresponding flip-flop FF1A, associated input pins D1, SI1 and SE1, associated output pin Q1, clock pin CK, multiplexer M1 and corresponding signal paths, partition netlist file 115-2A includes corresponding flip-flop FF2A, associated input pins D2, SI2 and SE2, associated output pin Q2, clock pin CK, multiplexer M2 and corresponding signal paths, and partition netlist file 115-3A includes corresponding flip-flop FF3A, associated input pins D3, SI3 and SE3, associated output pin Q3, clock pin CK, multiplexer M3 and corresponding signal paths.

Figure 4A:
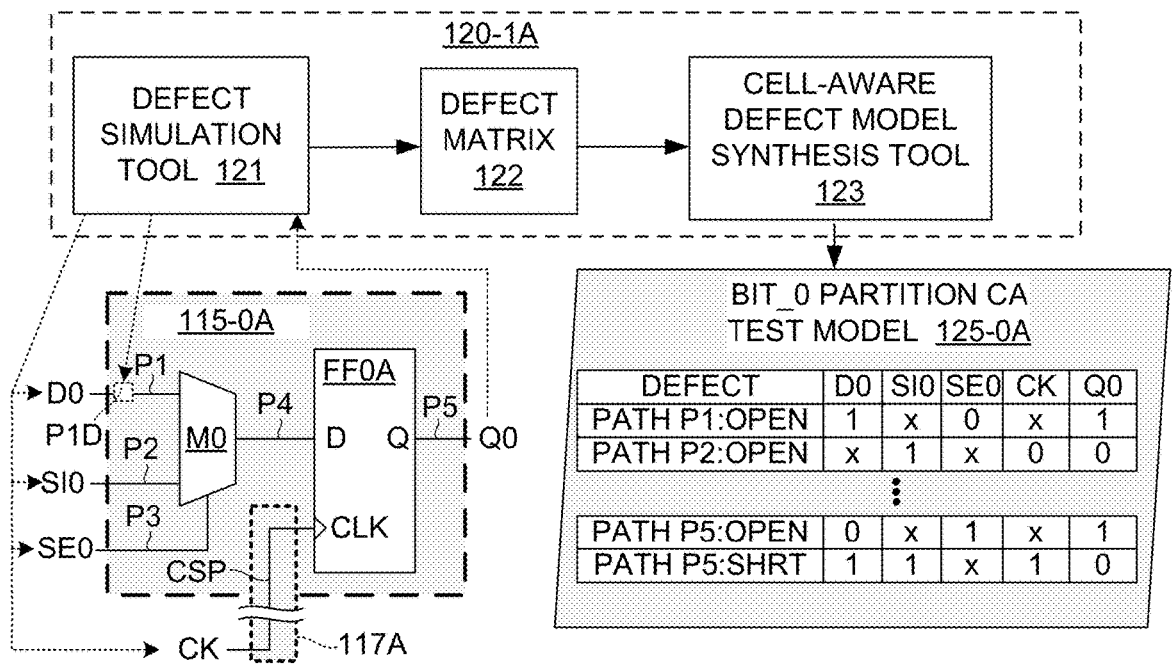
FIGS. 4A, 4B, 4C and 4D depicts the generation of four cell-aware test models for the four single-bit partitions depicted in FIG. 3.
Figure 4B:
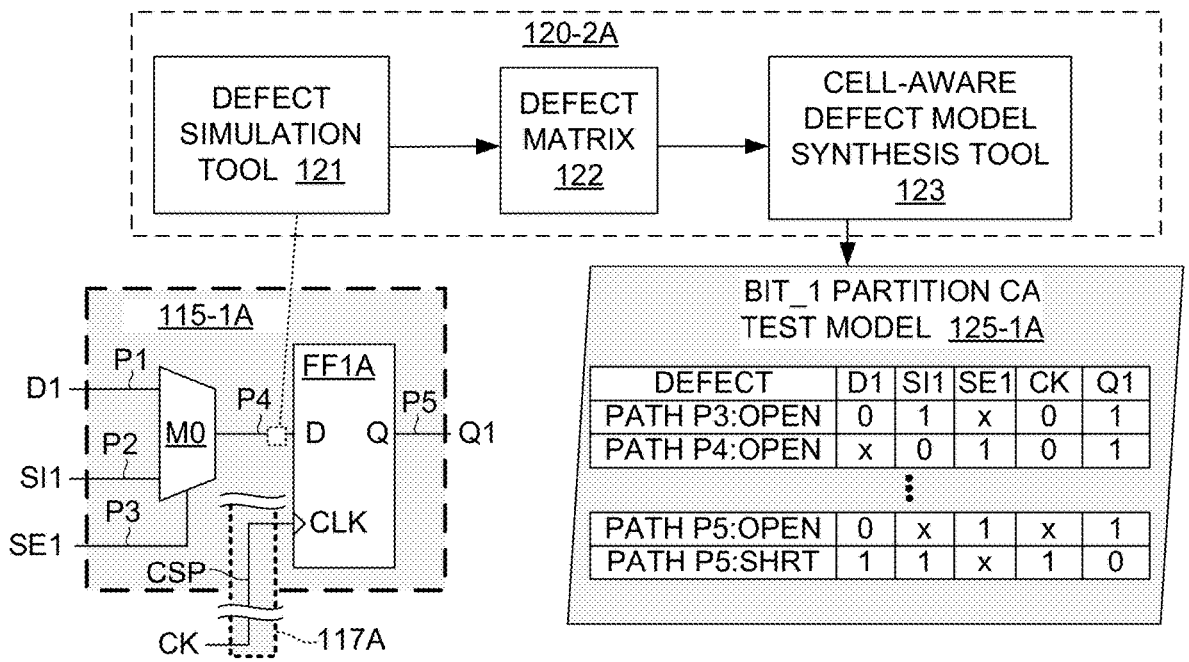
Figure 4C:
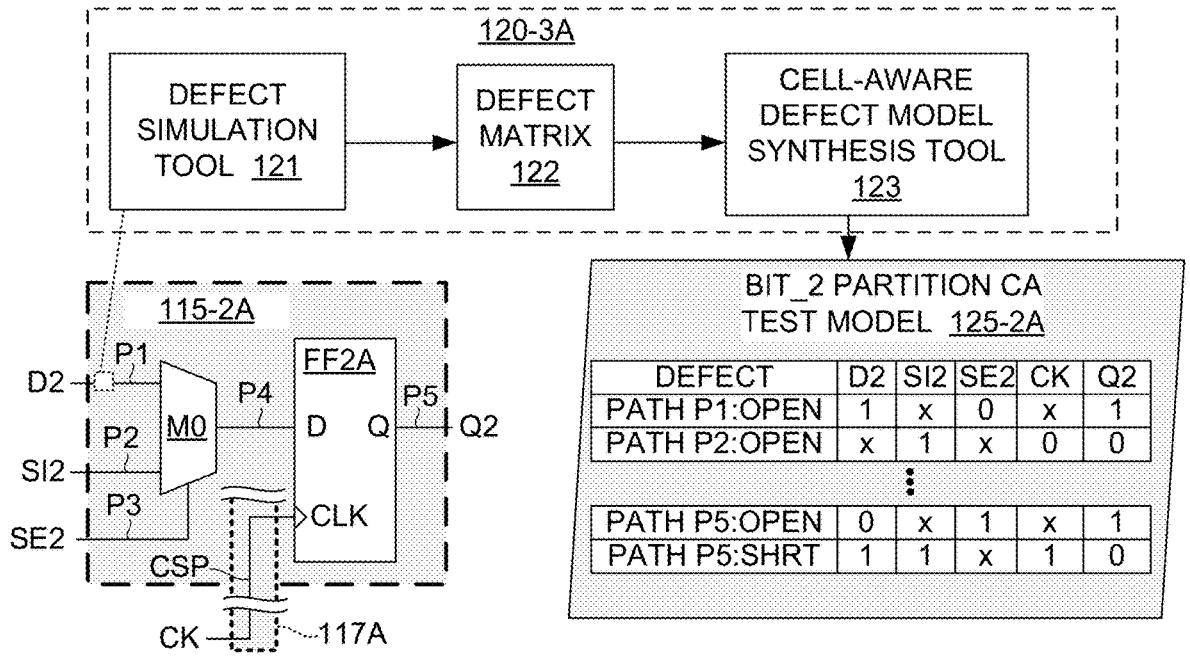
Figure 4D:
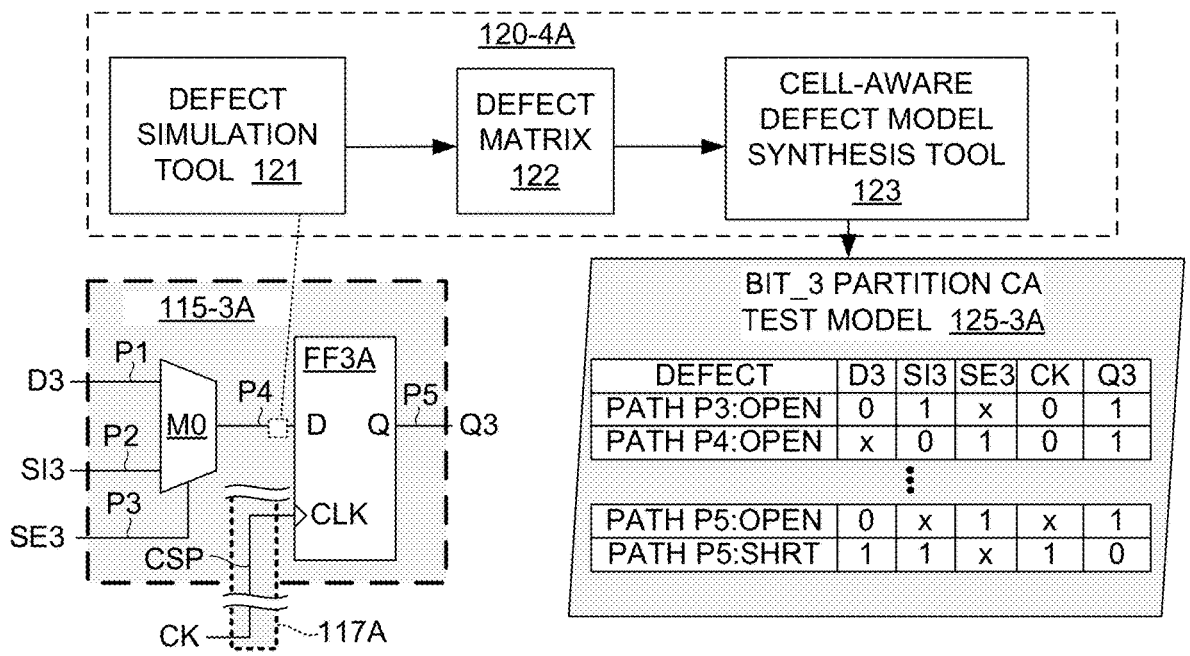
Figure 5:
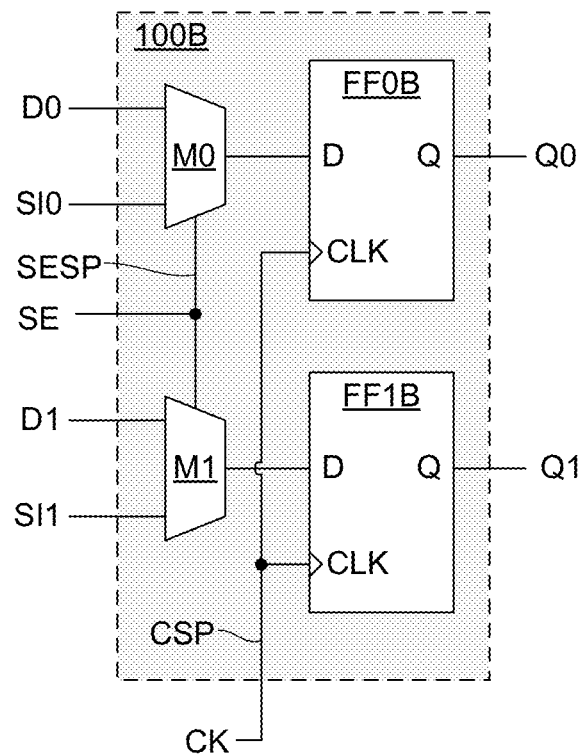
FIG. 5 depicts a simplified multibit cell according to another exemplary embodiment of the present invention.
Figure 6A:
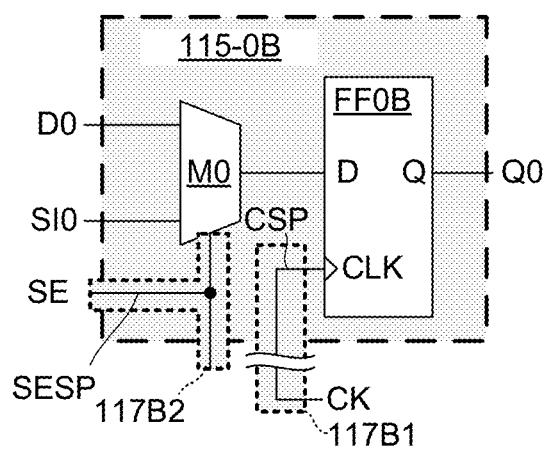
FIGS. 6A and 6B depict relevant portions of the multibit cell of FIG. 5 after being partitioned into two single-bit partition that share a common input pin in accordance with another embodiment of the present invention.
Figure 6B:
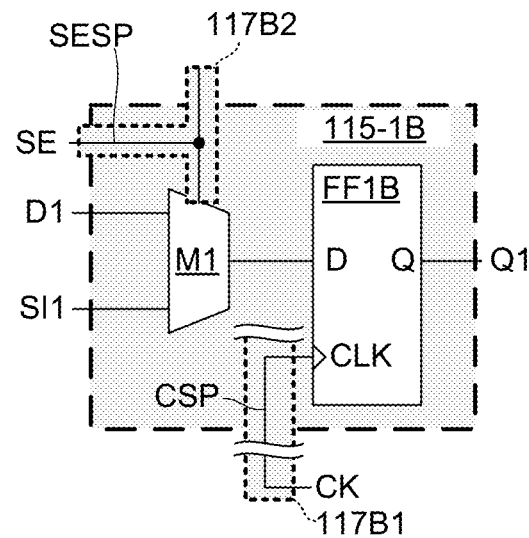

In a presently preferred embodiment, partitioning involves identifying shared (circuit) portions of N-bit cell netlist file 100S that are used to transmit either a control signal or an input signal to two or more related flip-flops, and configuring partition netlist files 115-1 to 115-N such that each related partition netlist file (i.e., the partition netlist files that include one of the two or more of related flip-flops) includes the associated shared portions. For example, referring to FIG. 3, four-bit cell netlist file 100A represents an example in which a shared portion 117A includes clock (control) pin CK and clock signal path CSP, which is coupled to clock input terminals CLK of each flip-flop FF0A to FF3A (i.e., such that all four flip-flops FF0A to FF3A are controlled by a single clock signal CK). Accordingly, as indicated in FIGS. 4A to 4D, partitioning four-bit cell netlist file 100A involves configuring each partition netlist file 115-0A to 115-3A to include portion 117A (i.e., clock pin CK, clock signal path CSP, and any active or parasitic elements that might be coupled to clock signal path CSP). FIG. 5 depicts a second example involving a two-bit cell netlist file 100B in which both clock signal CK and scan-select input signal SE are shared by flip-flops FF0B and FF1B. In this case, as depicted in FIGS. 6A and 6B, netlist file 100B is partitioned into two partition netlists 115-0B and 115-1B in a manner similar to that described above, where both partition netlists 115-0B and 115-1B include a first shared portion 117B1 including shared clock pin CK and clock signal path CSP, and also include a second shared portion 117B2 including shared scan-select input signal SE and associated signal path SESP. Although the process of including shared portions in each related partition netlist file causes the total number of pins of N partitions to be greater than the pins of the original (non-partitioned) N-bit cell, the total time required to simulate the N partitions is substantially less than the time required to simulate the associated N-bit cell because each partition includes a substantially lower number input pins and elements, whereby simulation of the N partitions involves a significantly lower number of vectors and cell-aware defects than that required to simulate the original N-bit cell.

Referring again to FIG. 1, cell-aware test models 125-1 to 125-N are then generated from each partition netlist file 115-1 to 115-N using a selected cell-aware defect characterization process (block 120). That is, cell-aware defect behavior extraction is performed multiple times (i.e., either sequentially or in parallel), whereby cell-aware test models 125-1, 125-2 and 125-N are generated by performing cell-aware defect behavior extraction on partition netlists 115-1, 115-2 and 115-N, respectively. FIG. 4A depicts the generation of a first "Bit_0" partition cell-aware test model 125-0A for partition netlist file 115-A0 according to a generalized embodiment using a defect simulation tool 121 and a cell-aware defect model synthesis tool 123. Defect simulation tool 121 applies an exhaustive series of simulated defects (e.g., open, bridge/short, transistor-leakage, transistor-drive-strength, port-bridge and port-open) to the various elements and signal lines of partition netlist 115-0A, typically one at a time, and simulates operation of the defective partition netlist 115-A0 in response to an exhaustive series of simulated input combinations applied to the input pins. Defect simulation tool 121 then compares the resulting partition output values at output pin Q0 to "known-good" output values in order to identify input combinations that produce erroneous output values for each simulated defect. For example, FIG. 4A depicts defect simulation tool 121 when simulating an open defect P1D on signal line P1 (indicated by the dashed box in FIG. 4A), and applying various input signal values combinations to input pins D0, SI0, SE0 and CK and monitors output pin Q0 in order to identify one or more combinations of input signals that generate an erroneous output value on output pin Q0. The complete set of input combinations and associated defects and their detection status by each input combination are analyzed. The faults that are detected by the same input combinations are classified as equivalence faults. Finally, the analysis results are stored into tables, and written into a file, this is the cell-aware test model. The process then generates partition cell-aware test model 125-0A including test data that may be utilized to identify each defect in a physical instantiation of four-bit cell 100A (FIG. 2). As indicated in FIGS. 4B, 4C and 4D, subsequent to (or in parallel with) the cell-aware defect characterization process shown in FIG. 4A, separate cell-aware defect characterization processes are performed for partition netlist files 115-1A, 115-2A and 115-3A, thereby generating cell-aware test models 125-1A, 125-2A and 125-3A, respectively. Note that the various input signal values and defects depicted in cell-aware test models 125-0A to 125-3A are arbitrary generated solely for illustrative purposes. Also, the cell-aware defect characterization process depicted in FIGS. 4A to 4D is intended to be exemplary (i.e., in other embodiments, cell-aware test models may be generated using other cell-aware defect characterization processes that are known in the art). Referring again to the lower portion of FIG. 1, in one embodiment cell-aware test models 125-1 to 125-N generated by the selected cell-aware defect characterization process are collectively stored as N-bit cell test model 125.

Referring to the lower portion of FIG. 1, an exemplary utilization of N-bit cell test model 125 is depicted for explanatory purposes. In this case, a fabrication system 160 performs an associated fabrication process to generate an IC device 160 including a physical instantiation 100P of N-bit cell 100. N-bit cell test model 125 is provided to a test/diagnostic system 180 before or during subsequent physical-aware logic diagnosis (test/diagnostic processes) performed on physical IC device 165 using known techniques (e.g., using an ATPG tool 181 that functions in a similar to that used by conventional cell-aware ATPG tools). In accordance with an aspect of the present invention, test/diagnostic system 180 performs physical-aware logic diagnosis by way of independently applying cell-aware test models 125-1 to 125-N to an associated physical N-bit cell instantiation 100P. Because each cell-aware test models 125-1 to 125-N corresponds to an associated portion of the overall layout of N-bit cell instantiation 100P, the resulting defect diagnosis (e.g., yield analysis) report 185 provides more accurate location data for each detected defect. That is, in traditional logic diagnosis and cell-aware diagnosis flows, a multibit cell is treated as a single big standard cell; that is, during physical-aware fault diagnosis, the fault diagnosis tool can only point to the bounding box of the big multibit cell. For example, for scan chain failure diagnosis, the diagnosis tool usually points to the scan cell that has the defect—if such a scan cell is part of a multibit cell, without partitioning, the physical diagnosis only provides the bounding box of the full multibit cell bounding box, which is usually a big area in the layout. In contrast, the multibit cell partitioning utilized in accordance with the present invention facilitates identifying the bounding box of each partition, which is much smaller than the bounding box of the full multibit cell, whereby the location of defective elements or signal lines in each partition are more easily determined. Accordingly, during physical-aware logic diagnosis, the physical layout bounding-box of each partition (bit) provides more detailed and accurate defect location. The highly accurate defect location information provided in defect diagnosis/yield analysis report 185 may then be utilized to improve yields in subsequent fabrication runs, for example, by way of providing feedback data 187 configured to modify the layout of elements within the associated multibit cell(s), or by way of providing feedback data 188 configured to facilitate corrective changes to process parameters utilized by fabrication system 160.

In alternative specific embodiments, the process of partitioning N-bit cells into N partitions (see block 120, FIG. 1) may be performed using one of a structural back-tracing technique, a logic simulation technique, or any other suitable technique. Partitioning by way of an exemplary structural back-tracing technique is described below in FIGS. 7A to 7D with reference to an exemplary netlist 100C corresponding to a three-bit cell including scan flip-flops FF0C, FF1C and FF2C. Partitioning by way of an exemplary logic simulation technique is described below in FIGS. 8A to 8C with reference to an exemplary netlist 100D corresponding to a two-bit cell including scan flip-flops FF0D and FF1D. The techniques described with reference to these figures are greatly simplified for brevity.

Referring to FIGS. 7A-7D, an exemplary structural back-tracing partitioning technique involves back-tracing from a selected output pin along each encountered signal path to all input pins and control pins that are operably coupled to the selected output pin, and then creating an associated partition netlist file that contains all elements and pins of the multibit cell that were encountered during the back-tracing process.

Figure 7A:
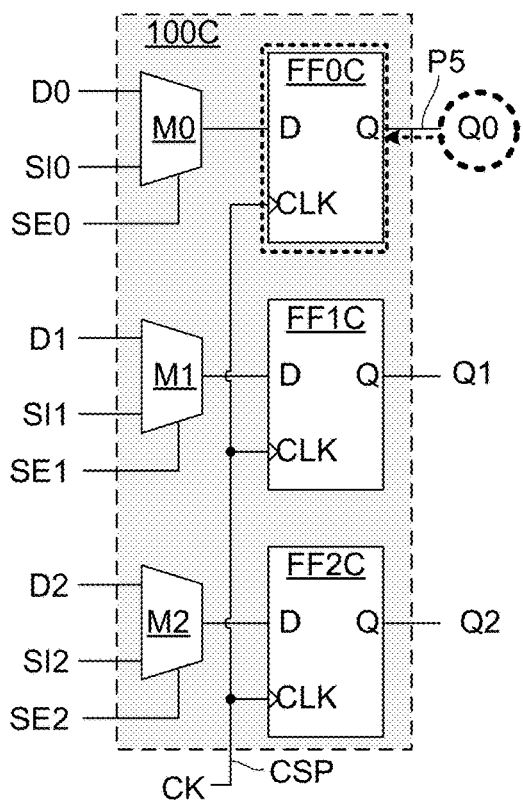
FIGS. 7A, 7B, 7C and 7D depict a structural back-tracing partitioning technique utilized to partition multibit cells according to a specific embodiment of the present invention.
Figure 7B:
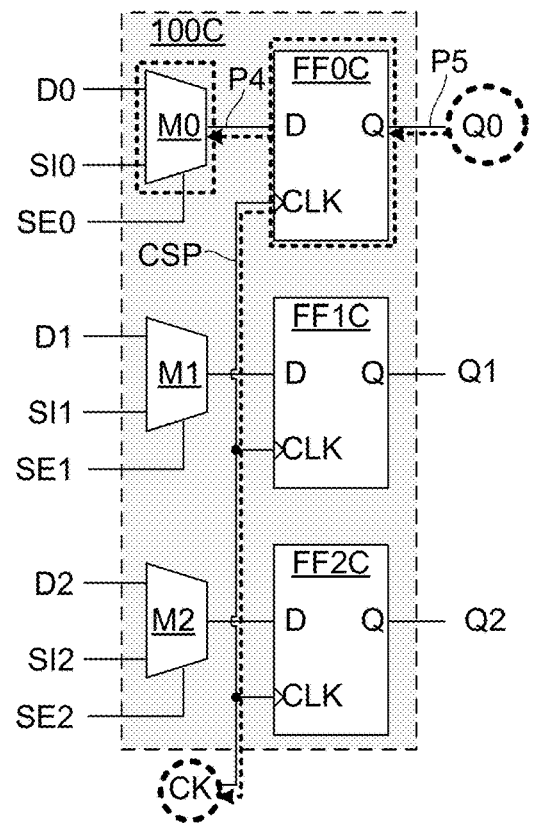
Figure 7C:
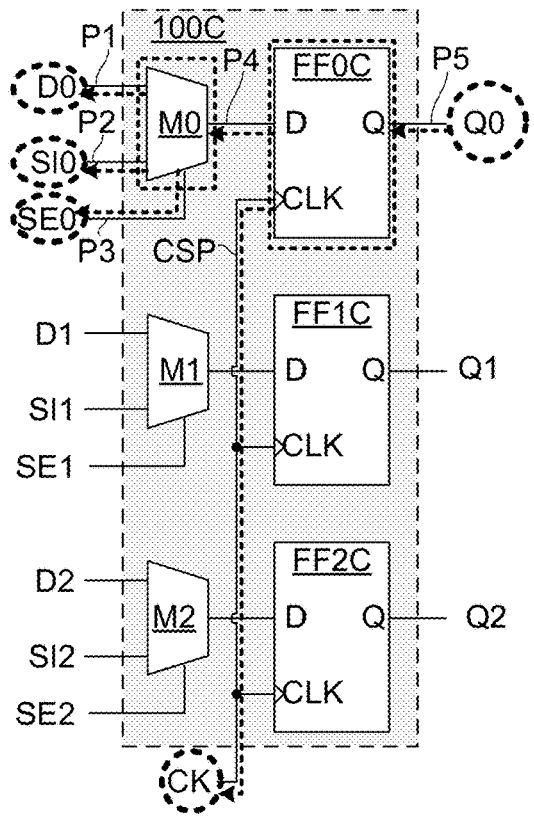
Figure 7D:
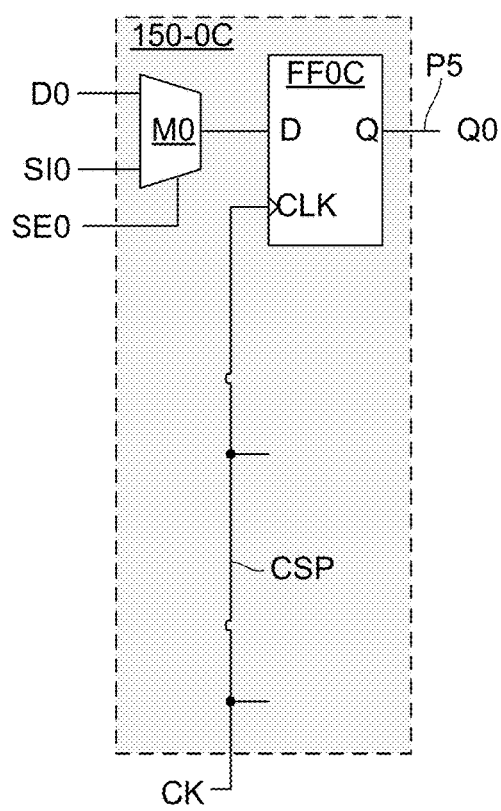

FIG. 7A depicts selecting output pin Q0, and a first back-tracing phase involving back-tracing along signal path P5 (i.e., the only signal path connected to output pin Q0) from selected output pin Q0 to output terminal Q of flip-flop FF0C. In one embodiment, all elements and pins that are encountered during the back-tracing process are marked (i.e., flagged or otherwise recorded) as being part of the partition including output pin Q0, and marking is indicated in FIGS. 7A to 7C by way of dashed-lines. For example, flip-flop FF0C is marked (i.e., as the dashed-line box surrounding flip-flop FF0C in FIG. 7A) because it was encountered during the first phase of back-tracing from output pin Q0. FIG. 7B depicts a second phase back-tracing along each signal path used to transmit input and control signals to flip-flop FF0C. In this case, the second phase includes back-tracing along signal path P4 from input terminal D of flip-flop FF0C to the output terminal of multiplexer M0, back-tracing along clock signal path CSP from clock terminal CLK of flip-flop FF0C to the clock pin CK, and marking both of multiplexer M0 and clock pin CK. FIG. 7C depicts a third phase of back-tracing along signal paths P1, P2 and P3 used to transmit input/select signals to multiplexer M0, and marking input pins D0, SI0 and SE0. At this point, no further back-tracing operations are possible because input/control pins have been encountered on every back-tracing path, so back-tracing is complete. FIG. 7D depicts creating an associated partition netlist file 115-0C containing only the marked elements and pins encountered during the back-tracking process. The back-tracing process described above with reference to FIGS. 7A to 7D is then repeated for each remaining output pin (i.e., output pins Q1 and Q2) of multibit cell netlist 100C.

A second structural back-tracing partitioning technique is defined by way of the following pseudo-code:

---

Multibit_cell_partition_by_tracing_back_from_output_pin:
Set stack S=empty;
For each bit of the multibit cell:
    Clear flag of all elements in the SPICE netlist
    For each output pin of the current bit:
        Add the output pin to stack S
    While (stack S is not empty): {
        Pop an element from the stack:
        Trace back from the element:
            If its driver is a resistor, flag the resistor
                and push the driver to S
            If its driver is a capacitor, flag the
                capacitor and push the driver to S
            If its driver is a transistor terminal:
                If it is "gate" flag the "gate" node
                If it is "drain" flag the transistor, push
                    the "source" and "gate" to S
                If it is "source", flag the transistor, push
                    the "drain" and "gate" to S
}

---

All flagged resistors, capacitors and transistors belong to this bit partition
    Write out the SPICE netlist for this bit partition.

Figure 8A:
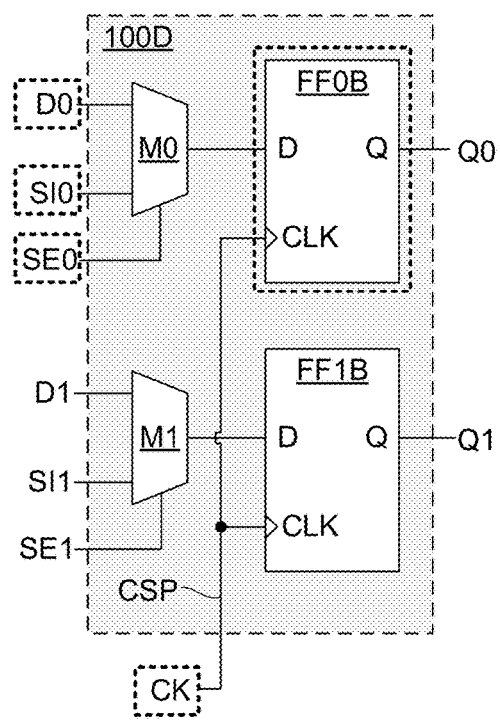
FIGS. 8A, 8B and 8C depict a logic simulation-type partitioning technique utilized to partition multibit cells according to another specific embodiment of the present invention.
Figure 8B:
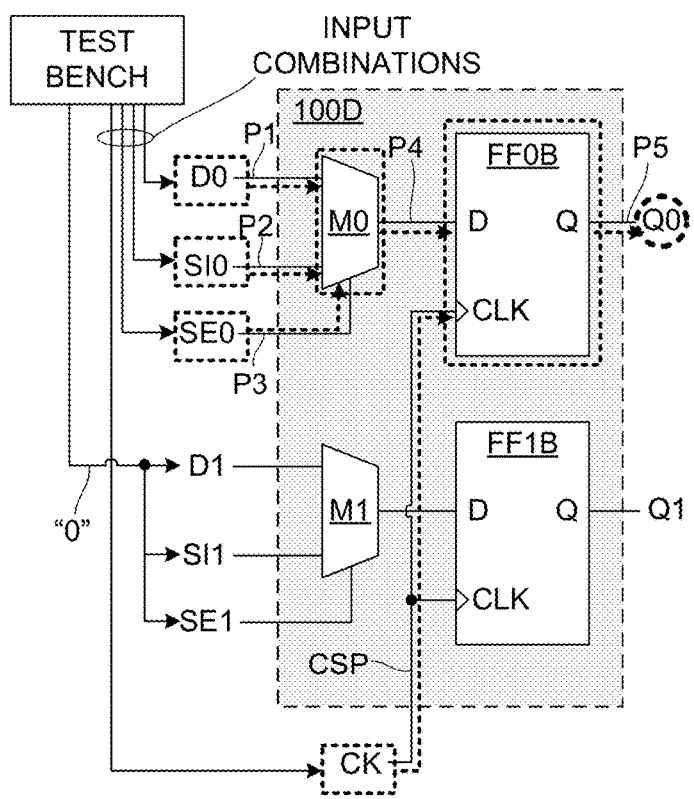
Figure 8C:
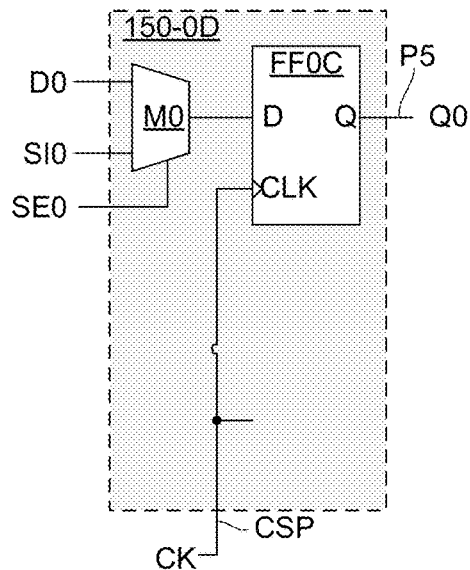

Referring to FIGS. 8A-8C, an exemplary logic simulation partitioning technique involves simulating operation of the multibit cell netlist file by applying input signal combinations to associated input/control pins of a selected flip-flop while maintaining the remaining input/control pins at a constant level (e.g., at logic "0"), and then creating an associated partition netlist file that contains only the elements of the multibit cell netlist file that undergo at least one operating state change during the applied simulation. FIG. 8A depicts the selection and marking of flip-flop FF0D, and the identification/marking of associated input pins (i.e., D0, SI0 and SE0) that are operably coupled to input terminal D of selected flip-flop FF0D, and clock (control) pin CK, which is operably coupled to clock (control) terminal CLK of selected flip-flop FF0D. FIG. 8B depicts simulating operation of two-bit cell netlist file 100D by way of applying various input combinations (e.g., different patterns of logic "0" and logic "1") to marked input/control pins D0, SI0, SE0 and CK while maintaining the remaining input/control pins of two-bit cell netlist file 100D (i.e., input pins D1, SI1 and SE1) at a constant level (e.g., "0"). In one embodiment, all active and passive circuit elements of the multibit cell that undergo at least one operating state change (e.g., toggle between "1" and "0") in response to the applied various input combinations is marked as being associated with selected flip-flop. In this case, multiplexer M0 and output pin Q0 are marked are marked as being associated with selected flip-flop FF0D, along with all passive or parasitic elements coupled to signal paths P1, P2, P3, P4, P5 and CSP that undergo at least one operating state change (e.g., toggle between "1" and "0") in response to the applied various input combinations. FIG. 8C depicts creating an associated partition netlist file 115-0D containing only the marked elements and pins encountered during the logic simulation process. The logic simulation process described above with reference to FIGS. 8A to 8C is then repeated for remaining flip-flop FF1D of multibit cell netlist 100D.

Figure 9:
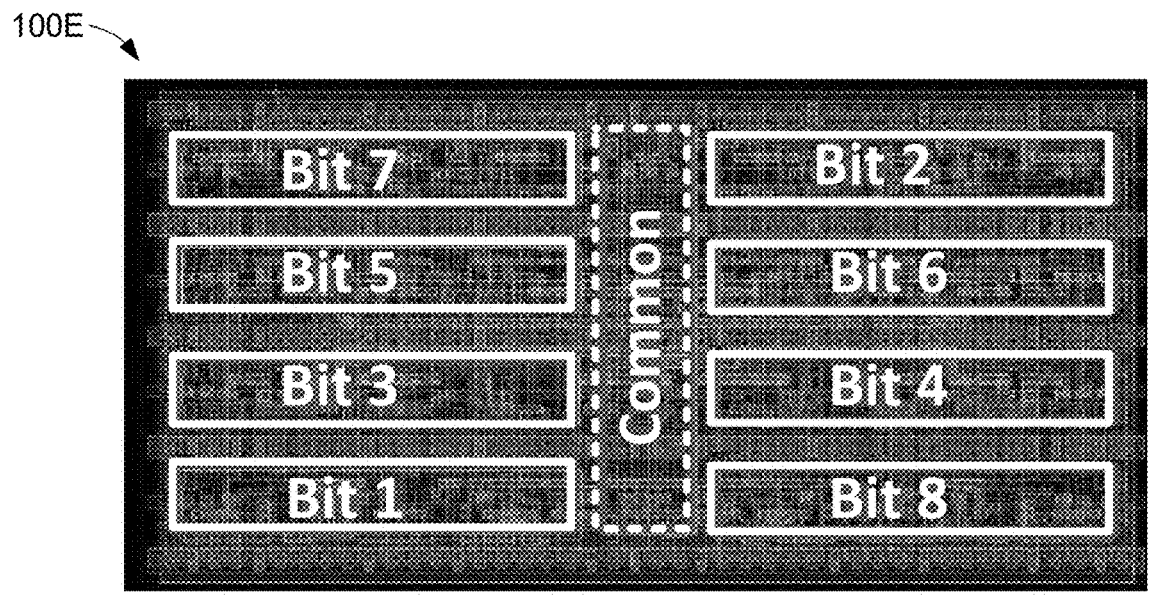
FIG. 9 is a plan view showing a circuit layout associated with an eight-bit cell according to another exemplary embodiment of the present invention.
Figure 10A:
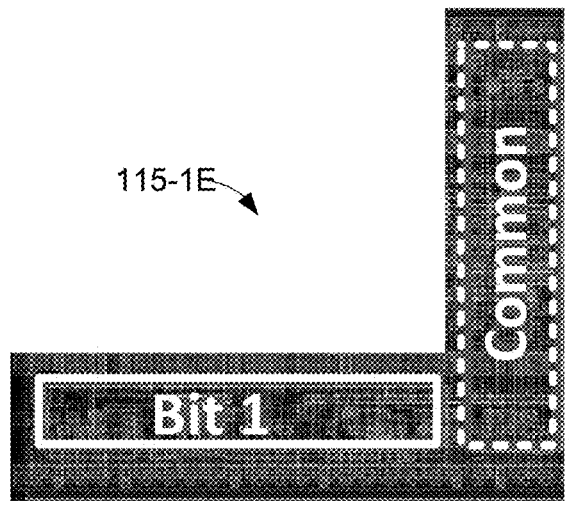
FIGS. 10A and 10B are plan views showing partial circuit layouts associated with corresponding partitions of the eight-bit cell of FIG. 9.
Figure 10B:
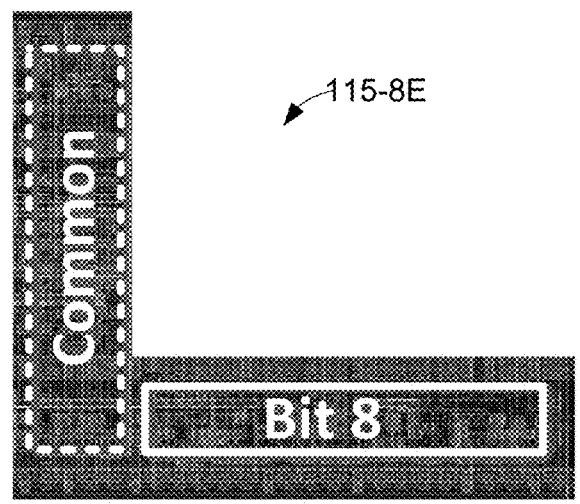

A second logic simulation partitioning technique is defined by way of the following pseudo-code:
    Multibit cell partition base on logic simulation:
    For each bit of the multibit cell
    (1) Clear the flag of all elements in the SPICE netlist
    (2) Let n be the number of input pin of this bit
    (3) Create $2^n$ vectors that contain $2^n$ combinations of then input pins
    (4) Perform SPICE simulation of the $2^n$ vectors while holding all other input pins 0 (5) Record the simulation values of all SPICE elements for all vectors
    (6) Flag an element if it toggled between 0 and 1 during the simulation
    (7) All flagged resistors, capacitors and transistors belong to this bit partition
    (8) Write out the SPICE netlist for this bit partition FIG. 9 depicts a layout view associated with an eight-bit cell netlist 100E, and FIGS. 10A and 10B depict in layout format two exemplary partition netlist files 115-1E and 115-8E, which are generated from eight-bit cell netlist 100E according to another exemplary embodiment of the present invention. Referring to FIG. 9, eight-bit cell 100E includes eight flip-flops generally designated by regions Bit1 to Bit8, and also includes shared circuitry Common that is operably coupled to the eight flip-flops disposed in regions Bit1 to Bit8. In this example, partitioning includes generating eight partition netlist files that are respectively configured such that each partition netlist file includes an associated flip-flop and said shared circuitry Common. For example, FIG. 10A shows exemplary partition netlist file 115-1E including region Bit1, which contains a first flip-flop, and shared circuitry Common. Similarly, FIG. 10B shows exemplary partition netlist file 115-8E including region Bit8 and shared circuitry Common. Six additional partition netlist files (not shown) are also generated that respectively include one of remaining region Bit2 to Bit7 and shared circuitry Common.

As set forth above, this present invention utilizes a "divide-and-conquer" strategy to efficiently characterize cell-aware defects for multibit cells by way of partitioning each multibit cell into multiple single-bit cells. As set forth above, conventional methods usually require from days to weeks to characterize eight-bit cell 100E (FIG. 9), which makes it unpractical to characterize a set of library cells including dozens up to hundreds of multibit cells. In contrast, by partitioning multibit cell netlists as set forth above, the present invention achieves cell-aware defect characterization in significantly less time—for example, the inventors have observed five-times faster cell-aware defect characterization for four-bit cells, and nine-times faster cell-aware defect characterization for eight-bit cells such as that shown in FIG. 9. The substantially faster cell-aware defect characterization achieved by the present invention may be explained as follows. In general, the characterization cost to generate cell-aware test model for a cell is: Nvec*Ndef, where Nvec is the number of vectors to simulate, and Ndef is the number of potential defects to be injected into the SPICE netlist. Nvec is proportional to $2^{Ninput}$, where Ninput is the number of input pins of the multibit cell. Ndef is proportional to the number of elements (resistors, capacitors and transistors) in the cell. By partitioning the multibit cell into multiple single-bit, the present invention effectively reduced both Ndef and Ninput. For example, for an eight-bit cell with seventeen input pins, Nvec is proportional to $2^{17}$ (two to the power of seventeen), which is equal to 131,072. In contrast, by way of partitioning the eight-bit cell in the manner described above with reference to FIGS. 10A and 10B, the Nvec is proportional to $2^3$ (two to the power of three), assuming there is one common pin among the eight partitions, and the total number of vectors Nvec for the eight partitions together is proportional to eight times two to the power of 3 (i.e., $8*2^3$), which is equal to 64, which represents a significant reduction in the number of test vectors required to characterize the eight partitions versus the entire eight-bit cell.

Technology Specific EDA System/Workflow Explanation

Figure 11:
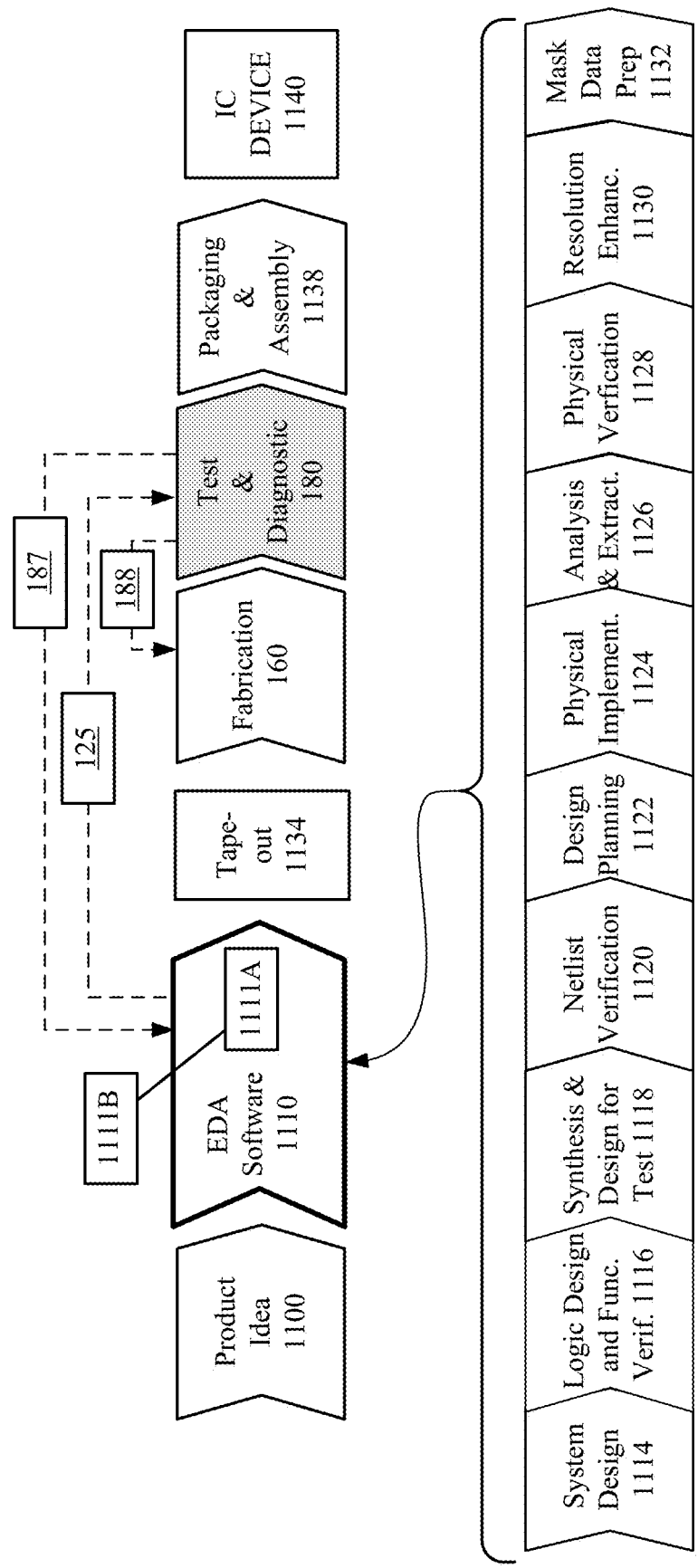
FIG. 11 is a flowchart illustrating various operations in the design and fabrication of an integrated circuit in accordance with an embodiment of the present disclosure.

FIG. 11 illustrates various processes performed in the design and fabrication of IC devices using software tools with a computer to transform data and instructions that represent the associated IC devices. These processes start with the generation of a product idea (1100) with information supplied by one or more circuit designers. The product idea is realized as the evolving circuit design during the circuit design process performed by the circuit designer(s) using EDA software tools (1110). One or more steps of the EDA software design process performed by EDA software tools (1110) is implemented using a computer-readable medium 1111A that is read by a computer 1111B. EDA software tools may also be signified herein using the singular "EDA software tool", as EDA software, or as a design tool. When a circuit design is finalized, it is typically taped-out (1134), and then multiple ICs, each being a physical implementation of the final circuit design, are fabricated on a semiconductor wafer (160) using a selected technology node. As described above with reference to FIG. 1, the fabricated IC devices 165 are then tested, and fabrication flaws/defects associated with a physical multibit cell instantiation 100P are identified and diagnosed using the cell-aware test models 125-0 to 125-N, and in some cases feedback information 187 and 188 (indicated by dashed-line arrows) that is generated by test and diagnosis system 180 is utilized to modify one or more of the fabrication process 160 or the circuit design layout stored by EDA software tool 1110 in order to improve production yields during subsequent fabrication sessions. The semiconductor wafer is then diced into individual chips, with each chip including one of the ICs, and then the chips are packaged and assembled using corresponding processes (1138), resulting in finished IC device 1140.

Note that the design process that uses EDA software tools (1110) includes operations 1114-1132, which are described below. This design flow description is for illustration purposes only and is not meant to limit the present disclosure. For example, an actual circuit design may require a circuit designer to perform the design operations in a different sequence than the sequence described herein.

During system design (1114), a circuit designer describes the functionality to be performed by the manufactured IC device. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products. Cells or other descriptions including all relevant information pertaining to the two-part USB PHY configuration of the present invention are typically copied from a library accessible by way of the EDA software tool, and inserted into a circuit design during the system design process.

Then, during logic design and functional verification (1116), VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test (1118), VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

Moreover, during netlist verification (1120), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

Furthermore, during design planning (1122), an overall floor plan for the integrated circuit is constructed and analyzed for timing and top-level routing. Exemplary EDA software products from Synopsys, Inc. of Mountain View, Calif. that can be used at this stage include: Astro and IC Compiler products.

Additionally, during physical implementation (1124), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: the Astro and IC Compiler products.

Then, during analysis and extraction (1126), the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products. In one embodiment, the cell-aware defect characterization/method described herein may be utilized to generate test models for circuit design versions generated during analysis and extraction.

Next, during physical verification (1128), the design is checked to ensure correctness for manufacturing issues, electrical issues, lithographic issues, and circuitry. Exemplary EDA software products from Synopsys, Inc. of Mountain View, Calif. that can be used at this stage include the Hercules product. In one embodiment, the cell-aware defect characterization/method described herein may be utilized to generate test models for circuit design versions generated during physical verification.

Moreover, during resolution enhancement (1130), geometric manipulations of the layout are performed to improve manufacturability of the design. Exemplary EDA software products from Synopsys, Inc. of Mountain View, Calif. that can be used at this stage include: Proteus, Proteus, and PSMGED products. In one embodiment, the cell-aware defect characterization/method described herein may be utilized to generate test models for circuit design versions generated during resolution enhancement.

Additionally, during mask-data preparation (1132), the 'tape-out' data for production of masks to produce finished integrated circuits is provided. Exemplary EDA software products from Synopsys, Inc. of Mountain View, Calif. that can be used at this stage include the Cats. family of products.

For all of the above mentioned integrated circuit design tools, similar tools from other EDA vendors, such as Cadence and Mentor Graphics can be used as an alternative. Additionally, similarly non-commercial tools available from universities can be used.

Embodiments of the present disclosure can be used during one or more of the above-described stages. Specifically, some embodiments of the present disclosure can be used in EDA software 1110.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Hardware/Software Equivalence

Certain innovations, embodiments and/or examples described herein comprise and/or use a processor. As used herein, the term "processor" signifies a tangible information processing device that physically transforms information, for example, data. As defined herein, "data" signifies information that can be in the form of an electrical, magnetic, or optical signal that is capable of being stored, accessed, transferred, combined, compared, or otherwise manipulated by an information processing device.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For information structured in binary form, any processor that can transform the information using the AND, OR and NOT logical operations (and their derivatives, such as the NAND, NOR, and XOR operations) can transform the information using any function of Boolean logic. A processor such as a neural network processor can also transform information non-digitally. There is no scientific evidence that any of these processors are processing, storing and retrieving information, in any manner or form equivalent to the bioelectric circuitry of the human brain.

As used herein, the term "module" signifies a tangible information processing device that typically is limited in size and/or complexity. For example, one or more methods or procedures in a computer program can be referred to as a module. A module can also refer to a small network of digital logic devices, in which the logic devices often may be interconnected to form a network. In many cases, methods and procedures in a computer program written in a specialized language, such as System C, can be used to generate a network of digital logic devices that process information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Altera), Random Access Memories (RAMS) or microprocessors. A module is configured to process information, typically using a sequence of operations to transform the information (or in the case of ROMs and RAMS, transforming information by using the input information as an address for memory that stores output information), to perform aspects of the present innovations, embodiments and/or examples of the invention.

Modules that are temporarily configured need not be configured at any one instance in time. For example, an information processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a sequence or set of operations or instructions that a module can use to transform information to achieve a result. A module can comprise one or more algorithms. As used herein, the term "computer" includes an information processor that can perform certain operations such as (but not limited to) the AND, OR and NOT logical operations, with the addition of memory (for example, memory based on flip-flops using the NOT-AND or NOT-OR operation). Such a digital computer is said to be Turing-complete or computationally universal. A computer, whether or not it is a digital computer, typically comprises many modules.

As used herein, the term "software" or "program" signifies one or more algorithms and data structures that configure an information processing device for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of instruction and data that configure the information processing device to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from an information storage device. The computer typically has a device for reading storage media that is used to transport the software, or has an interface device that receives the software over a network.

Technology Specific General Computer Explanation

FIGS. 12A, 12B and 12C are simplified block diagrams of a computer system suitable for generating and verifying circuit designs using the multi-dimensional constraint solver of the present invention. Computer system 3110 typically includes at least one computer or processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a television, a network router, switch or bridge, or any data processing machine capable of executing instructions (sequential or otherwise) that specify actions to be taken by that machine. Innovations, embodiments and/or examples of the claimed inventions are neither limited to conventional computer applications nor the programmable apparatus that run them. To illustrate, the innovations, embodiments and/or examples of the claimed inventions can include an optical computer, quantum computer, analog computer, or the like. Aspects of the present invention are well suited to multi-processor or multi-core systems and may use or be implemented in distributed or remote systems. Processor here is used in the broadest sense to include singular processors and multi-core or multi-processor arrays, including graphic processing units, digital signal processors, digital processors and combinations of these elements. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 3110 depicted in FIG. 12A is intended only as a specific example for purposes of illustrating the preferred embodiments. Many other configurations of computer system 3110 are possible having more or less components than the computer system depicted in FIG. 12A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example the Internet.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118. User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide nonvisual display such as via audio output devices. In general, use of the term "output device" is intended to include all possible types of devices and ways to output information from computer system 3110 to the user or to another machine or computer system.

Memory subsystem 3126 typically includes a number of memories including a main random access memory (RAM) 3130 for storage of instructions and data during program execution and a read only memory (ROM) 3132 in which fixed instructions are stored. In one embodiment, RAM 3130 also serves to store partition netlist files, cell-aware test models and other data utilized during execution of the cell-aware fault characterization method described herein. File storage subsystem 3128 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 3128. Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses.

When configured to execute an EDA software tool including the cell-aware fault characterization method described herein, computer system 3110 depicted in FIG. 12A represents an electronic structure suitable for creating a circuit design. FIG. 12B shows a memory 3140 such as a non-transitory, computer readable data storage medium associated with file storage subsystem 3128, and/or with network interface subsystem 3116, and includes a data structure 3180 specifying a circuit design describing an integrated circuit. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light). FIG. 12C is a block representing an IC 3190 designed and fabricated in accordance with the processes described above, where circuit 3190 is fabricated in accordance with the circuit design of data structure 3180 (see FIG. 12B).

The foregoing Detailed Description signifies in isolation individual features, structures or characteristics described herein and any combination of two or more such features, structures or characteristics, to the extent that such features, structures or characteristics or combinations thereof are based on the present specification as a whole in light of the knowledge of a person skilled in the art, irrespective of whether such features, structures or characteristics, or combinations thereof, solve any problems disclosed herein, and without limitation to the scope of the claims. When an embodiment of a claimed invention comprises a particular feature, structure, or characteristic, it is within the knowledge of a person skilled in the art to use such feature, structure, or characteristic in connection with other embodiments whether or not explicitly described.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent. For example, although the present invention is described with reference to basic multibit cells that include only scan flip-flops, the proposed partition technique may be extended to efficiently create cell-aware test models for more complex multibit cells, such as a multibit multiplexer cell with many inputs, outputs, and controls pins, or a multibit adder cell.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

The invention claimed is:

1. A computer-implemented cell-aware defect characterization method configured to generate a cell-aware test model for a multibit cell including a plurality of flip-flops, a plurality of input pins coupled to input terminals of said plurality of flip-flops, a plurality of output pins coupled to output terminals of said plurality of flip-flops, and one or more control pins coupled to control terminals of said plurality of flip-flops, the method comprising:

receiving, by the computer, a multibit cell netlist file that operably describes a plurality of elements utilized by the multibit cell to operably transmit input signals from the plurality of cell input pins to the input terminals of plurality of flip-flops, and to operably transmit output signals from the output terminals of the plurality of flip-flops to the plurality of cell output pins;

partitioning the multibit cell netlist file into a plurality of partition netlist files such that each said partition netlist file includes a corresponding flip-flop of said plurality of flip-flops, an associated portion of said plurality of input pins operably coupled to said input terminals of said corresponding flip-flop, an associated portion of said plurality of output pins operably coupled to said output terminals of said corresponding flip-flop, an associated portion of said one or more control pins coupled to said control terminals of said corresponding flip-flop, and an associated portion of said plurality of elements that are coupled to one or more signal paths operably extending between said corresponding flip-flop and said portion of said input pins and said portion of said output pins; and generating a cell-aware test model for each partition netlist file of the plurality of partition netlist files.

2. The method of claim 1, wherein said partitioning further comprises identifying at least one shared portion of said multibit cell netlist file that transmits one of a control signal and an input signal to two or more of said plurality of flip-flops, and configuring said plurality of partition netlist files such that said one or more shared portions is present in each said partition netlist file that includes one of said two or more of said plurality of flip-flops.

3. The method of claim 2, wherein said one or more control pins comprises a clock pin that is operably coupled by way of a clock signal path to a clock input terminal of each of said plurality of flip-flops, and wherein said partitioning comprises configuring each partition netlist file of the plurality of partition netlist files to include said clock pin and said clock signal path.

4. The method of claim 2, wherein said plurality of input pins comprises a shared input pin that are operably coupled by way of a corresponding input signal path to said input terminals of two or more of said plurality of flip-flops, and wherein said partitioning comprises configuring each partition netlist file of the plurality of partition netlist files to include said shared input pin and said corresponding input signal path.

5. The method of claim 1, wherein generating said cell-aware test model comprises performing fault simulation on each said partition netlist file, and then utilizing results from said fault simulation to generate said cell-aware test model for each said partition netlist file.

6. The method of claim 1, wherein said partitioning comprises:
selecting an output pin from the plurality of output pins;
back-tracing from the selected output pin to corresponding portions of said plurality of input pins and said plurality of control pins that are operably coupled to said selected output pin by way of associated signal paths, wherein said back-tracing includes marking each element of said plurality of elements that is operably coupled to at least one of said each signal paths; and
creating an associated partition netlist file of said plurality of partition netlist files containing only said marked elements.

7. The method of claim 1, wherein said partitioning comprises:
selecting a flip-flop from the plurality of flip-flops;
simulating operation of said multibit cell netlist file by applying a plurality of input combinations to said associated portion of said plurality of input pins and said plurality of control pins that are operably coupled to said input terminals of said selected flip-flop while maintaining a remainder of said plurality of input pins of said multibit cell netlist file at a constant level;
marking each element of said plurality of elements that undergoes at least one operating state change during said during said simulating; and
creating an associated partition netlist file of said plurality of partition netlist files containing only said marked elements.

8. The method of claim 1,
wherein said multibit cell includes at least eight flip-flops and shared circuitry operably coupled to each said at least eight flip-flops, and
wherein said partitioning comprises generating at least eight partition netlist files, each of said at least eight partition netlist files including an associated flip-flop of said at least eight flip-flops and said shared circuitry.

9. In an electronic design automation (EDA) tool in a computer, a cell-aware defect characterization tool configured to automatically generate a cell-aware test model for a multibit cell stored in a cell library, said multibit cell including a plurality of flip-flops, a plurality of input pins coupled to input terminals of said plurality of flip-flops, a plurality of output pins coupled to output terminals of said plurality of flip-flops, and one or more control pins coupled to control terminals of said plurality of flip-flops, said cell-aware defect characterization tool including instructions that, when executed by a processor of said computer, cause the processor to perform a method comprising:
receiving, by the computer, a multibit cell netlist file that operably describes a plurality of elements utilized by the multibit cell to operably transmit input signals from the plurality of cell input pins to the input terminals of plurality of flip-flops, and to operably transmit output signals from the output terminals of the plurality of flip-flops to the plurality of cell output pins;
partitioning the multibit cell netlist file into a plurality of partition netlist files such that each said partition netlist file includes a corresponding flip-flop of said plurality of flip-flops, an associated portion of said plurality of input pins operably coupled to said input terminals of said corresponding flip-flop, an associated portion of said plurality of output pins operably coupled to said output terminals of said corresponding flip-flop, an associated portion of said one or more control pins coupled to said control terminals of said corresponding flip-flop, and an associated portion of said plurality of elements that are coupled to one or more signal paths operably extending between said corresponding flip-flop and said portion of said input pins and said portion of said output pins; and
generating a cell-aware test model for each partition netlist file of the plurality of partition netlist files.

10. The cell-aware defect characterization tool of claim 9, wherein said partitioning further comprises identifying at least one shared portion of said multibit cell netlist file that transmits one of a control signal and an input signal to two or more of said plurality of flip-flops, and configuring said plurality of partition netlist files such that said one or more shared portions is present in each said partition netlist file that includes one of said two or more of said plurality of flip-flops.

11. The cell-aware defect characterization tool of claim 10,
wherein said one or more control pins comprises a clock pin that is operably coupled by way of a clock signal path to a clock input terminal of each of said plurality of flip-flops, and
wherein said partitioning comprises configuring each partition netlist file of the plurality of partition netlist files to include said clock pin and said clock signal path.

12. The cell-aware defect characterization tool of claim 10,
wherein said plurality of input pins comprises a shared input pin that are operably coupled by way of a corresponding input signal path to said input terminals of two or more of said plurality of flip-flops, and
wherein said partitioning comprises configuring each partition netlist file of the plurality of partition netlist files to include said shared input pin and said corresponding input signal path.

13. The cell-aware defect characterization tool of claim 9, wherein generating said cell-aware test model comprises performing fault simulation on each said partition netlist file, and then utilizing results from said fault simulation to generate said cell-aware test model for each said partition netlist file.

14. The cell-aware defect characterization tool of claim 9, wherein said partitioning comprises:
selecting an output pin from the plurality of output pins;
back-tracing from the selected output pin to corresponding portions of said plurality of input pins and said plurality of control pins that are operably coupled to said selected output pin by way of associated signal paths, wherein said back-tracing includes marking each element of said plurality of elements that is operably coupled to at least one of said each signal paths; and
creating an associated partition netlist file of said plurality of partition netlist files containing only said marked elements.

15. The cell-aware defect characterization tool of claim 9, wherein said partitioning comprises:
selecting a flip-flop from the plurality of flip-flops;
simulating operation of said multibit cell netlist file by applying a plurality of input combinations to said associated portion of said plurality of input pins and said plurality of control pins that are operably coupled to said input terminals of said selected flip-flop while maintaining a remainder of said plurality of input pins of said multibit cell netlist file at a constant level;

marking each element of said plurality of elements that undergoes at least one operating state change during said during said simulating; and creating an associated partition netlist file of said plurality of partition netlist files containing only said marked elements.

16. The cell-aware defect characterization tool of claim 9, wherein said multibit cell includes at least eight flip-flops and shared circuitry operably coupled to each said at least eight flip-flops, and wherein said partitioning comprises generating at least eight partition netlist files, each of said at least eight partition netlist files including an associated flip-flop of said at least eight flip-flops and said shared circuitry.

17. An apparatus, comprising: a processor; and a non-transitory computer-readable storage medium storing instructions that, when executed by the processor, cause the processor to perform a method for generating a cell-aware test model for a multibit cell, said multibit cell including a plurality of flip-flops, a plurality of input pins coupled to input terminals of said plurality of flip-flops, a plurality of output pins coupled to output terminals of said plurality of flip-flops, and one or more control pins coupled to control terminals of said plurality of flip-flops, the method comprising:

receiving, by the computer, a multibit cell netlist file that operably describes a plurality of elements utilized by the multibit cell to operably transmit input signals from the plurality of cell input pins to the input terminals of plurality of flip-flops, and to operably transmit output signals from the output terminals of the plurality of flip-flops to the plurality of cell output pins;

partitioning the multibit cell netlist file into a plurality of partition netlist files such that each said partition netlist file includes a corresponding flip-flop of said plurality of flip-flops, an associated portion of said plurality of input pins operably coupled to said input terminals of said corresponding flip-flop, an associated portion of said plurality of output pins operably coupled to said output terminals of said corresponding flip-flop, an associated portion of said one or more control pins coupled to said control terminals of said corresponding flip-flop, and an associated portion of said plurality of elements that are coupled to one or more signal paths operably extending between said corresponding flip-flop and said portion of said input pins and said portion of said output pins; and generating a cell-aware test model for each partition netlist file of the plurality of partition netlist files.

18. The apparatus of claim 17, wherein said partitioning further comprises identifying at least one shared portion of said multibit cell netlist file that transmits one of a control signal and an input signal to two or more of said plurality of flip-flops, and configuring said plurality of partition netlist files such that said one or more shared portions is present in each said partition netlist file that includes one of said two or more of said plurality of flip-flops.

19. The apparatus of claim 17, wherein said partitioning comprises:

selecting an output pin from the plurality of output pins;

back-tracing from the selected output pin to corresponding portions of said plurality of input pins and said plurality of control pins that are operably coupled to said selected output pin by way of associated signal paths, wherein said back-tracing includes marking each element of said plurality of elements that is operably coupled to at least one of said each signal paths; and creating an associated partition netlist file of said plurality of partition netlist files containing only said marked elements.

20. The apparatus of claim 17, wherein said partitioning comprises:

selecting a flip-flop from the plurality of flip-flops;

simulating operation of said multibit cell netlist file by applying a plurality of input combinations to said associated portion of said plurality of input pins and said plurality of control pins that are operably coupled to said input terminals of said selected flip-flop while maintaining a remainder of said plurality of input pins of said multibit cell netlist file at a constant level;

marking each element of said plurality of elements that undergoes at least one operating state change during said during said simulating; and creating an associated partition netlist file of said plurality of partition netlist files containing only said marked elements.

* * * * *

UNITED STATES PATENT AND TRADEMARK OFFICE
CERTIFICATE OF CORRECTION

PATENT NO. : 10,528,692 B1
APPLICATION NO. : 16/177033
DATED : January 7, 2020
INVENTOR(S) : Ruifeng Guo et al.

Page 1 of 1

It is certified that error appears in the above-identified patent and that said Letters Patent is hereby corrected as shown below:

On the Title Page

Item (73) should read:
(73) Assignee: Synopsys, Inc., Mountain View, CA
             (US)

Signed and Sealed this
Tenth Day of November, 2020

Andrei Iancu
*Director of the United States Patent and Trademark Office*